US008536892B2

(12) United States Patent
Apte

(10) Patent No.: US 8,536,892 B2
(45) Date of Patent: Sep. 17, 2013

(54) SYSTEM FOR TESTING TRANSISTOR ARRAYS IN PRODUCTION

(75) Inventor: Raj B. Apte, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 296 days.

(21) Appl. No.: 12/040,807

(22) Filed: Feb. 29, 2008

(65) Prior Publication Data

US 2009/0219035 A1 Sep. 3, 2009

(51) Int. Cl.
*G01R 31/26* (2006.01)

(52) U.S. Cl.
USPC .................. 324/760.01; 324/760.02; 324/555

(58) Field of Classification Search
None
See application file for complete search history.

(56) References Cited

U.S. PATENT DOCUMENTS 6,866,887 B1 3/2005 Chen et al.
2007/0285365 A1* 12/2007 Lee ................................ 345/87

OTHER PUBLICATIONS

"Agilent Technologies Introduces Next-Generation Flat-Panel Display Test System; Complete Solution Delivers Fastest Throughtput, Multisite Test and Improved Defect Detection," Business Wire, pp. 1-3, Dec. 1, 2005.

"AKT Introduces AKT-40K EBT for Testing 7$^{th}$ Generation Flat Panel Display Substrates," Physorg.com, 1 page, Jun. 10, 2004.

Sanjiv Sambandan, "Defect Identification in large Area electronic Backplanes," Journal of Display Technology, vol. 5, No. 1, pp. 27-33, Jan. 2009.

William S. Wong et al., "Flexible a-Si:H-Based Image Sensors Fabricated by Digital Lithography," 5 pages, 2007.

Bing Sheu et al., "Modeling Charge Injection in MOS Analog Switches," IEEE Transactions on Circuits and Systems, vol. CAS-34, No. 2, pp. 214-216, Feb. 1987.

George Wegmann et al., "Charge Injection in Analog MOS Switches," IEEE Journal of Solid-State Circuits, vol. SC-22, No. 6, pp. 1091-1097, Dec. 1987.

R. B. Apte et al., "Large-Area, Now-Noise Amorphous Silicon Imaging System," SPIE, vol. 3301, pp. 2-8, 1998.

R. J. Yarema et al., "A Programmable, Low Noise, Multichannel Asic for Readout of Pixelated Amorphous Silicon Arrays," Fermi National Accelerator Laboratory, 5 pages, Aug. 1998.

* cited by examiner

*Primary Examiner* — Minh N Tang
(74) *Attorney, Agent, or Firm* — Fay Sharpe LLP

(57) ABSTRACT

An electronic test system to evaluate the pixel and array properties of active-matrix displays that use charge or current sensitive circuits attached to the array data lines is described. Leakage-current, charging time, and other metrics can be measured for all pixels in the array without electrical or optical connection to the interior of the array. Charge or current sensitive amplifiers and selected voltage drivers may be used in conjunction with variable timing and voltages to determine individual transistor properties over an entire array in just a few seconds. Signals to be measured may be injected in several ways. Ultimately, an output signal for each pixel is measured. Thus, based on the output signal, the charging time or current, the leakage time or current, and other pixel or transistor parameters may be characterized for the entire array.

26 Claims, 10 Drawing Sheets

SYSTEM FOR TESTING TRANSISTOR ARRAYS IN PRODUCTION

BACKGROUND

Active matrix arrays, used for applications such as liquid crystal displays, are typically produced based on very strict criteria. Finished displays may be characterized by human eye or by camera to detect gross defects, but it has heretofore been difficult and/or impractical to determine defects before applying the display medium or before the array is fully fabricated. This difficulty increases the cost of the process because defective arrays may be packaged and enter the marketplace.

Notwithstanding the difficulty in implementation or impracticality of use, large area electronic testers have been employed to test active matrix arrays. Pixel defects, line defects, and area (Mura) defects may be detected on display glass before the shorting bars are removed or the liquid crystal (LC) cell is constructed. Several types of these testers are in use.

For example, an 11,520 pin tester with multiple heads is known. Pin testing allows complete curve tracing of transistor arrays. However, this type of tester is not common in production because of a risk of scratching of the display through use of the pins or probes.

Another tester, based on placing an electro-optic sheet over the display and using test vectors and a camera, is known. The sheet is made from polymer-dispersed liquid crystals (PDLC) coated with a Bragg reflector. Essentially, this temporary sheet emulates a liquid crystal display. An image of the activated sheet is then obtained. This method is used more often than pin testers for display glass testing because all types of visual defects are easily seen. Transistor characteristics, however, are not directly measurable. This method is not generally used in production because of the need to apply the PDLC sheet to the array, which may result in damage.

Still another known method uses a secondary emission electron beam. This method can probe arrays with exposed metal by using an energy analyzer to determine the static potential of known conductors. Charging and discharging of pixels may be directly observed; however, this is a very complicated and expensive process.

BRIEF DESCRIPTION

The presently described embodiments comprise, in at least one form, a set of driving electronics, detector electronics, and algorithms to measure performance of active-matrix arrays without making direct pixel-by-pixel contact to the interior of the array. Charge- or current-sensitive column amplifiers and row driver circuits are used with variable timing and/or voltage to produce maps of measurands throughout the array. Measurands include transistor-on current, transistor-off current, and transistor threshold voltage.

According to the presently described embodiments, in at least one form, at least two sets of electronics are placed in contact with the array. The first set, comprising drivers, is used to strobe each row in the array. Because some pixel designs involve connection to more than one row line, the waveforms of the row drivers may consist of one or more signals, each with variable timing and amplitude.

In the presently described embodiments, in at least one form, a second set of electronics comprises of charge- or current-amplifiers connected to the array columns. This set of electronics is used to measure pixel responses produced by varying the drive signals and the plate.

In the presently described embodiments, in at least one form, a ground or common electrode may be part of the array design, and this common element may be used to inject signals into the entirety of the array by means of a plate driver. If the array design lacks a common electrode, one may be introduced by applying a capacitive film over the body of the array. This film would provide a capacitive common element to all the pixels of the array, and it may also be driven by a plate driver. Further, algorithms will be described in which no plate driver is required, either attached to an array common element or capacitive common element.

In the presently described embodiments, an optional third set of electronics comprising analog or digital drivers is connected to the array data lines. These drivers may be used to drive the pixel to an arbitrary state before readout.

In the presently described embodiments, an optional third set of electronics comprising analog or digital drivers is connected to the array data lines. These drivers may be used to drive the pixel to an arbitrary state before readout.

The presently described embodiments are used, in at least one form, to measure pixel circuit performance of active-matrix arrays. Such arrays may be used in liquid crystal displays, focal-plane image sensors, light-emitting displays, or other applications which require active matrices of pixels. The scope of the presently described embodiments are not limited by this list of active-matrix applications.

The presently described embodiments may be applied to a variety of active matrix configurations. Commonly, a single transistor is used in each pixel. The key parameters of this transistor in a simple active matrix are on-current, off-current, threshold voltage, and capacitance. Any of these parameters may be measured by a variety of algorithms using the electronics and measurements described above. Another variety of the simple active matrix design uses a dual-gate transistor for the pixel element. Compound active matrix designs of increasing complexity, with several or many transistors per pixel, may be measured with the present invention.

So, in one aspect of the presently described embodiments, a system comprises an injecting element operative to apply a drive voltage to selected transistors of an array, a readout circuit having amplifiers operative to selectively detect an output signal, and, a control circuit operative to control the injecting element and the readout circuit. In another aspect of the presently described embodiments, the injecting element is a gate driver.

In another aspect of the presently described embodiments, the gate driver is operative to apply a voltage to a first transistor and a readout circuit is operative to detect the output signal of a second transistor.

In another aspect of the presently described embodiments, the injecting element is a plate drive circuit.

In another aspect of the presently described embodiments, the plate drive circuit is operative to apply a voltage to a plate disposed on the array and the readout circuit is operative to detect the output signal of a transistor in the array.

In another aspect of the presently described embodiments, the controller is operative to selectively initiate the application of the drive voltage.

In another aspect of the presently described embodiments, the controller is operative to selectively process the output signal.

In another aspect of the presently described embodiments, the transistors are pixel elements in a liquid crystal display.

In another aspect of the presently described embodiments, the amplifiers are charge or current sensitive column amplifiers.

In another aspect of the presently described embodiments, the injecting element is a data driver operative to charge the transistors.

In another aspect of the presently described embodiments, the injecting element comprises the readout circuit operative to shift a bias level to charge the transistor.

In another aspect of the presently described embodiments, a method for testing a transistor array comprises selecting a first transistor row in the array to be tested, injecting a drive voltage into a gate terminal of a second transistor row operatively connected to the first transistor row, selectively detecting an output of the first transistor row and processing the output.

In another aspect of the presently described embodiments, the processing comprises measuring a charging time of the first transistor.

In another aspect of the presently described embodiments, the processing comprises measuring a discharging time of the first transistor.

In another aspect of the presently described embodiments, the processing comprises measuring a leakage time of the first transistor.

In another aspect of the presently described embodiments, a method for testing a transistor array comprises selecting a transistor row to be tested from the array, injecting a drive voltage into a plate terminal of the transistor, selectively detecting an output of the transistor row, and, processing the output.

In another aspect of the presently described embodiments, the processing comprises measuring a charging time of the transistor.

In another aspect of the presently described embodiments, the processing comprises measuring a discharging time of the transistor.

In another aspect of the presently described embodiments, the processing comprises measuring a leakage time of the transistor.

In another aspect of the presently described embodiments, the processing comprises measuring a turn-on voltage of the transistor.

In another aspect of the presently described embodiments, the applying of the drive voltage to a plate terminal of the transistor includes applying the drive voltage to a plate disposed on the array.

In another aspect of the presently described embodiments, a method for testing a transistor array comprises selecting a transistor row to be tested from the array, injecting a drive voltage to charge the transistor row through selected data lines, selectively detecting an output of the transistor row, and processing the output.

In another aspect of the presently described embodiments, the processing comprises measuring a charging time of the first transistor.

In another aspect of the presently described embodiments, the processing comprises measuring a discharging time of the first transistor.

In another aspect of the presently described embodiments, the processing comprises measuring a leakage time of the first transistor.

In another aspect of the presently described embodiments, the processing comprises measuring a turn-on voltage of the first transistor.

In another aspect of the presently described embodiments, a method for testing a transistor array comprises selecting a transistor row to be tested from the array, charging the transistor row by shifting a bias level of readout circuits of the transistor row, selectively detecting an output of the transistor row, and processing the output.

In another aspect of the presently described embodiments, the processing comprises measuring a charging time of the first transistor.

In another aspect of the presently described embodiments, the processing comprises measuring a discharging time of the first transistor.

In another aspect of the presently described embodiments, the processing comprises measuring a leakage time of the first transistor.

In another aspect of the presently described embodiments, the processing comprises measuring a turn-on voltage of the first transistor.

A variety of different measurements are possible within the scope of the present invention. Active matrices are employed for a variety of applications. The present invention can be adapted for different measurements and applications.

BRIEF DESCRIPTION OF THE DRAWINGS

A better understanding of the presently described embodiments may be obtained when the following detailed description is considered in conjunction with the drawings, in which:

FIG. 4(*b*) is a list of possible methods of array stimuli;

DETAILED DESCRIPTION

The presently described embodiments provide a method and a system for testing active matrix arrays such as liquid crystal displays, focal-plane image sensors, light-emitting displays, and electric paper. The techniques according to the presently described embodiments allow for testing of each pixel or transistor of the active matrix before liquid crystals or other media are applied to the active matrix and before the production of the system is complete. This allows for an early detection testing system that is conducive to high production environments.

Charge sensitive amplifiers and selected voltage drivers (and other mechanisms) may be used (as injecting elements) in conjunction with variable timing and voltages to determine individual pixel or transistor properties over an entire array in just a few seconds. Signals to be measured may be injected in several ways: first, a capacitive elastomer laminate (or plate) may be applied to the surface of the array, making a capacitance with the pixel pad; second, gate lines may be used to inject charge into pixels that connect to more than one gate line; third, digital or analog drivers connected to the data lines may be used to charge the pixel to varying states; fourth the dc-bias level of the charge or current sensitive readout electronics may be shifted relative to the gate voltages to charge the pixel. For example, a capacitive elastomer laminate (or plate) or gate lines of selected transistors may be used to inject charge into pixels or transistors. Connection in the system between components is achieved through flex connectors. Ultimately, an output signal for the transistor or pixel is measured or detected. This readout and processing of data to characterize the output may be accomplished by connecting data lines of the transistors to charge amplifiers and varying the readout timing. Thus, based on the output signal, the charging and leakage times of transistors may be characterized for the entire array.

Figure 1:
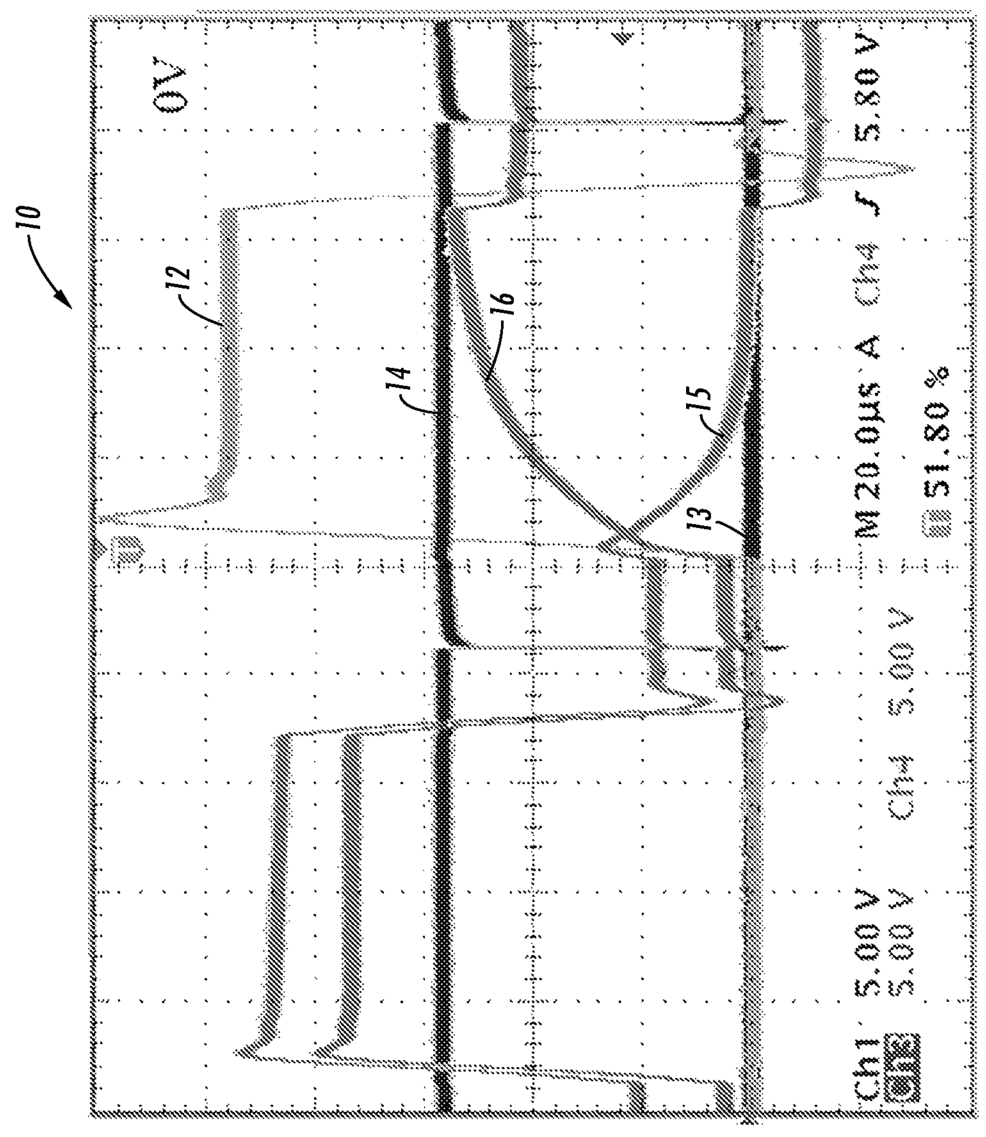
FIG. 1 illustrates an 'eye' diagram of the charging and discharging waveforms of a pixel. Both charging and discharging are super-posed for clarity.

With reference now to FIG. 1, the basic operation of a simple active matrix pixel is described. In this regard, a graph 10 illustrates a strobe voltage 12 that may be applied to allow readout of a row of the array. A data line voltage 14 and corresponding pixel voltage 16 is illustrated. Also shown are data line voltage 13 and corresponding output voltage 15. Basic characterization of an active matrix array comprises measuring: 1) the charging or discharging time, shown respectively by the slopes of voltages 16 and 15; 2) the leakage, shown by the change in the difference between voltages 16 and 15 on the left and right edge of graph 10; and 3) the dependence of both charging/discharging and leakage on the high and low voltages of strobe 12.

In FIG. 1, output voltage 16 is generated by, for example, strobing the gate of a previous transistor in the array so that the transistor being analyzed is likewise strobed, as shown by signal 12. This causes the pixels to charge or discharge depending on the level of the data voltage, e.g. voltage 14. As illustrated, the output voltage 15 results when the data voltage 13 is as shown.

Figure 2:
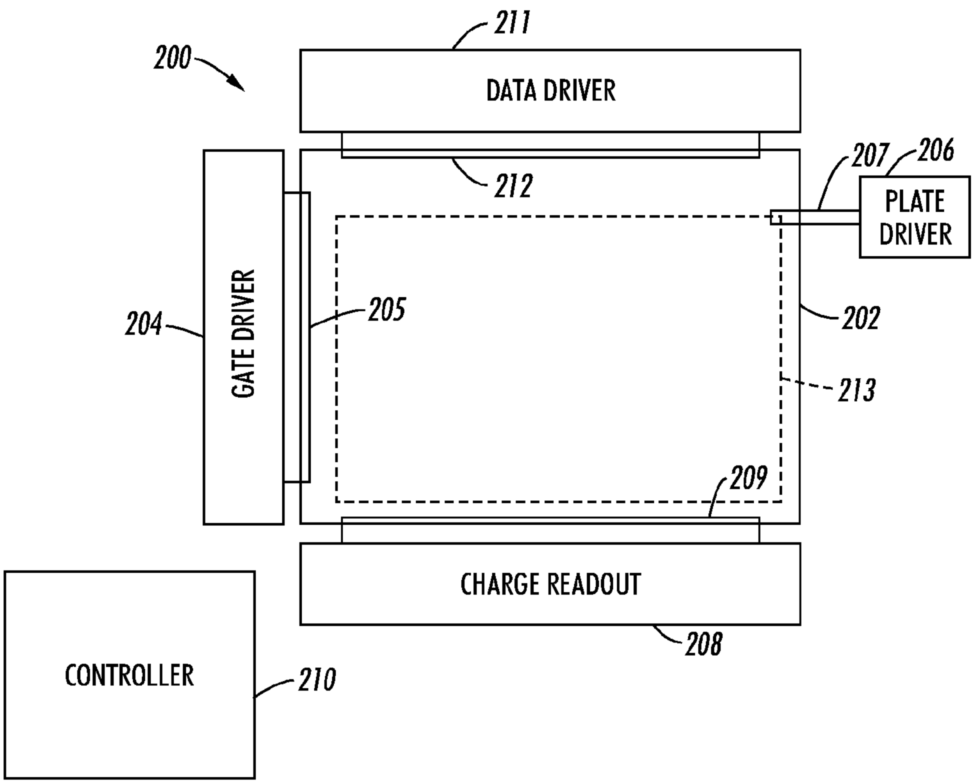
FIG. 2 illustrates the system configuration with basic components and optional components.

Referring now to FIG. 2, a system 200 according to the presently described embodiments is shown, in which array 202 is being tested. As shown, the system 200 incorporates a gate driver or circuit 204, having connector 205 operative to connect the gate driver to the array 202. The connector 205 is, in one form, flexible. Also shown is an optional plate driver or circuit 206, with a suitable connector 207. Likewise, the connector 207 is, in one form, flexible. The plate driver 206 is connected to a plate 213.

A readout device or circuit such as a charge readout device 208 is disposed at a position to appropriately readout output voltages of pixels of the array. The device or circuit 208 has a connector 209 provided thereto. For convenience, in one form, the connector 209 is flexible. Also shown in FIG. 2 is a controller or control circuit 210.

A data driver 211, while not necessary to measure basic pixel properties, may be used to drive individual pixels into continuous states for detailed pixel measurements. In the case of a simple active matrix 202 in which each pixel contains a single transistor, the complete current-voltage characteristic of the transistor may be characterized using analog data driver 211.

It should be appreciated that the gate driver 204 and plate driver 206 (and other components where desired) may be provided in combination with the system or may be provided separately, depending on the desired method of voltage injection that is used (as will be described in detail below). These drivers may take a variety of known forms.

In the case where a plate driver 206 is used, the corresponding plate 213 on the array, in one form, is a removable metal electrode sheet coated with a dielectric that will allow for delivery of voltages to each of the transistors. It should also be understood that all driver and readout components are floating relative to one another through the use of opto-couplers or differential signaling. This allows the data voltage, held constant relative to data board 208 ground by the readout, to vary with respect to the gate 204 and plate 206 voltages.

The plate driver or circuit 206 may be used to drive a liquid, elastomeric, or solid member, such as plate 213, in contact with the surface of the array. The plate driver 206 may also be used to drive an array ground, which is a net commonly used in active matrix arrays to provide a common reference or capacitance.

In one form, the gate driver 204 is capable of functioning as an analog drive circuit (varying voltage levels) and operating multiple gate lines simultaneously. Stimulus to a particular row of pixels may be applied either with the plate voltage or by using the previous gate line. In the latter case, the gate driver circuit will be substantially different from that used for charge mapping.

The controller or control circuit 210 may take a variety of forms. In this regard, the controller may be implemented using a variety of different hardware configurations and/or software techniques, provided that it appropriately controls the drivers 204, 206 (if used) and 211 (if used), as well as the charge readout mechanism 208. For example, the control circuit 210 is operative to initiate application of a drive voltage and/or process the output signal. Example methods for control are detailed in connection with FIGS. 4 and 5 below. The charge readout mechanism 208, in one form, will be described in greater detail in connection with FIG. 3.

Data driver 211 will, unless provision is made, short the charge detectors 208. There are several methods of operating the data driver 211: with tristate outputs for 211, with high-impedance inputs for 208, or with enabling transistors on the array 202 itself allowing disconnection of the charge detectors 208 while the driver 211 biases the array, and another set of enabling transistors on the array to allow disconnection of the driver 211 while the charge detectors 208 are operating.

Figure 3:
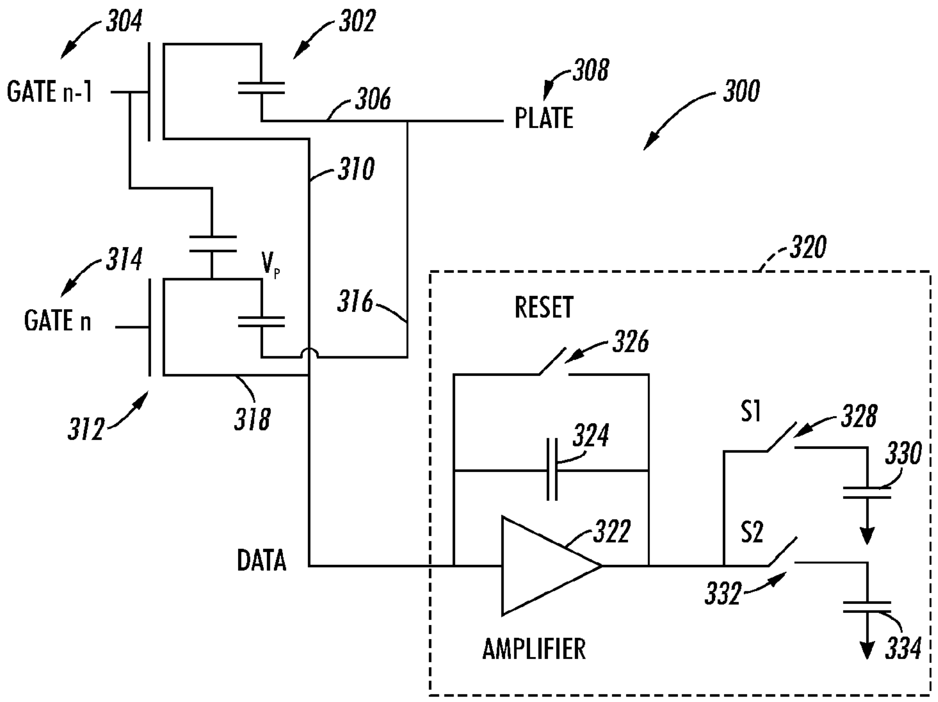
FIG. 3 illustrates a portion of a simple active matrix and associated charge readout electronics.

Referring now to FIG. 3, a portion 300 of the configuration shown in FIG. 2 is illustrated. More particularly, the portion 300 shows a pixel 302 and a pixel 312 that would be included on the array 202. As noted, these pixels correspond to transistors which, in at least one form, are thin film transistor (TFT) devices. The readout mechanism 320 is, in one form, included in the charge readout mechanism 208 of FIG. 2.

With more particular reference to FIG. 3, the pixel 302 has a gate terminal 304, a connection 306 to a plate terminal 308 and a data line 310. Also shown is the pixel 312 which includes a gate terminal 314, a connection 316 to the terminal plate 308, and a connection 318 to the data line 310.

The readout mechanism 320 comprises an amplifier 322 (e.g. a current or charge sensitive column amplifier) with parallel connections to at least one capacitor 324 and reset switch 326. Also shown in the readout mechanism are a switch 328 in series with at least one capacitor 330. In addition, a switch 332 and at least one capacitor 334 are shown in the circuit. The exact charge readout circuit 320 may take many forms, but generally comprises a charge or current detector, one or more sample-and-hold switches, and a shift register or multiplexer to enable serial readout.

It should be understood that the values of the capacitors may vary. In one form, the values correspond to values of the capacitors on the array, e.g. 0.1 pF to 2.0 pF In operation, several methods of signal injection may be used for the system of FIGS. 2 and 3. As will be seen from the description below, a variety of injecting elements may be implemented to do so.

In the first method, the gate electrode 304 of the transistor 302 is strobed to inject or apply pixel charge to the pixel 312. The strobe voltage may be different in magnitude, polarity, and timing from the normal gate pulse and may require specialized gate driver circuitry that resembles a display data driver.

In a second method of injecting signals, a sheet or plate formed of a conductor and optional dielectric (such as plate 213) is placed over the array 202 in order to couple to the pixel pads. This 'Plate' electrode takes the place of the medium capacitance, although the plate capacitance may be significantly higher or lower than the display medium. The gate drivers may resemble those of a normal display, since it's not necessary to activate more than one at a time.

In a third method of injecting signals, the connections 306 and 316 are connected to the array ground. This ground may be driven by the plate driver 206.

In fourth method of injecting signals, the array 202 may be operated for one frame in one bias condition, and a second time in a different bias condition. Examples of changes in bias conditions include changing the data voltage, the strobe high or low voltage, the plate or ground voltage, or the drive voltage from board 211.

In some arrays, a set of 'common' electrodes is used for the pixel capacitors, rather than the previous gate lines, as in the first noted method. This is a hybrid case that allows use of a simpler gate controller.

Example methods of operation of the overall system will be described in connection with FIGS. 4(*a*), 4(*b*) and 5. Such methods according to the presently described embodiments, at least in one form, comprise selecting a transistor row to be tested, injecting a drive voltage or charge by way of, for example, the above methods, selectively detecting an output of the transistors or transistor row and processing the output. The processing of the output may include measuring or characterizing charging time, discharging time, leakage time or turn-on voltage.

Figure 4A:
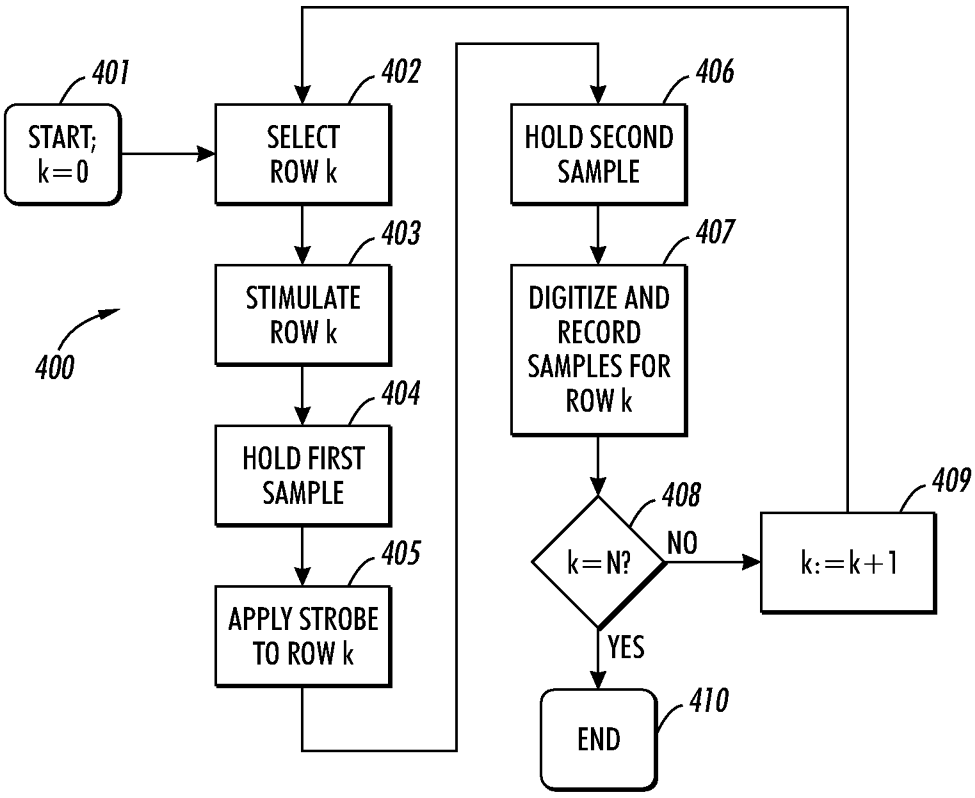
FIG. 4(*a*) is a flow chart showing a sample algorithm for measuring simple active matrices.
Figure 4B:
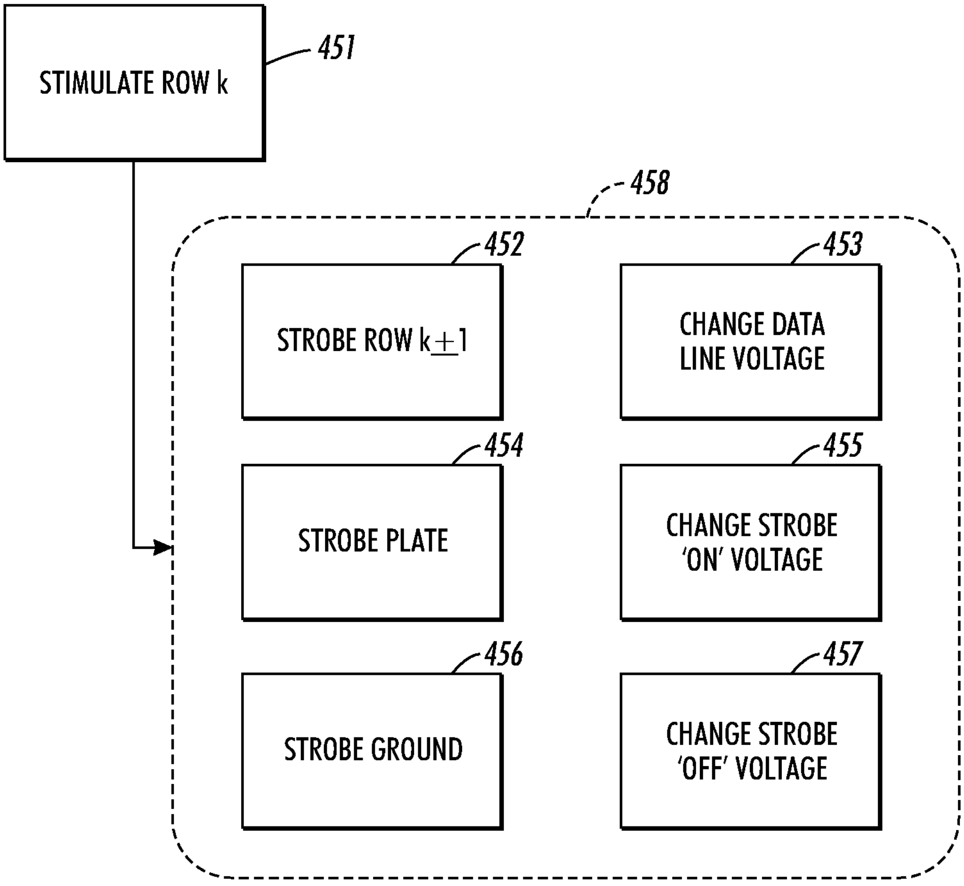

With reference now to FIGS. 4(*a*) and (*b*), a method 400 is illustrated. As noted above, this method may be implemented by the controller 210 of FIG. 2 so that the output of particular pixels or transistors may be characterized in a useful manner. This method may be implemented using a variety of hardware configurations and/or software techniques. Moreover, the routines that implement the method may be stored in the controller 210 or distributed in elements of the system.

The basic array readout is shown in method 400. The array 202 is mounted in the apparatus, and connections 205, 209, 212, and/or 207 are made. The array is then biased to levels suitable to the array. The array is then read out in which each row is selected (at 402) in turn, stimulated by some means (illustrated in FIG. 4(*b*) at 403, and then sampled twice, once at 404 before strobe 405, and once after at 406. These values are then sampled and shifted/digitized for further processing at 407. The sequence continues at 409 until the entire readout is complete at 408 and 410. Method 400 shows complete readout of the array, but sub-sets may be read out if desired.

It should be appreciated that characterization of the output may be accomplished in a variety of manners. These will be described in connection with FIGS. 6-9. However, briefly, characterization may involve processing the output signal to determine a variety of different features of the transistor such as charging time, discharging time, leakage time and turn-on time.

FIG. 4(*b*) shows a number of methods of stimulating row k, as required in step 403. Often in active matrices, the adjacent strobe electrode may be used as part of the pixel circuit. Row k may be stimulated by strobing adjacent rows 452. The plate or ground electrodes, if used, may be driven (454 and 456, respectively) to stimulate row k. The data voltage may be shifted (with commensurate shifting of related system voltages) to stimulate row k (at 453). Finally, the strobe "on" (455) and strobe "off" (457) may be shifted to stimulate row k. The collection of stimulus methods 458 shows readily adapted methods, but other methods of changing bias conditions for the whole array or stimulating row k may be developed for specific pixel designs.

Figure 5:
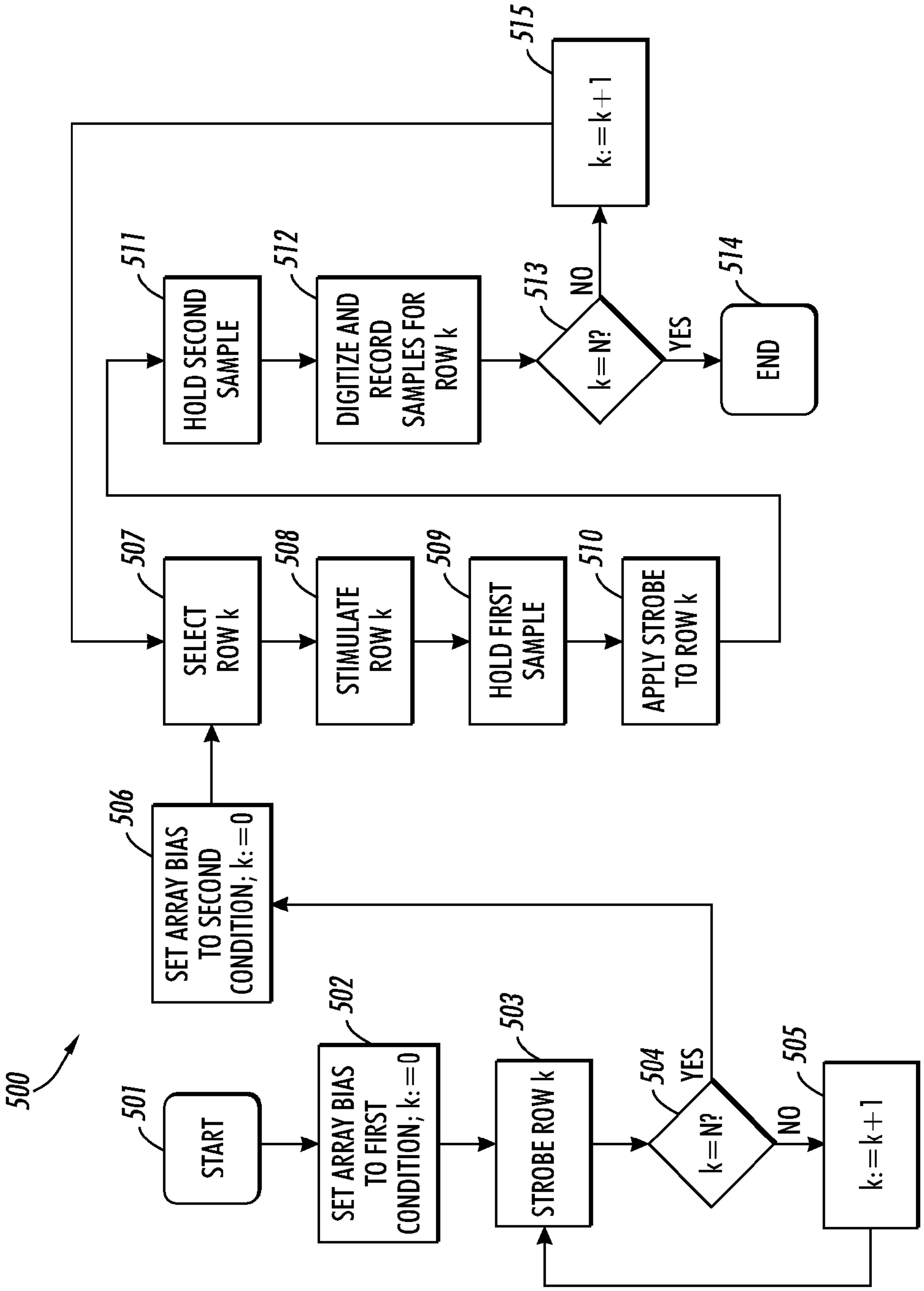
FIG. 5 is a flow chart showing a sample algorithm in which the array is set in one bias condition and read out in a second bias condition.

With reference to FIG. 5, method 500 shows array testing (beginning at 501) in which the array is set to a first bias condition 502, each of the rows is strobed (at 503) to allow the bias to propagate into the pixel. If all rows are not strobed (at 504) the sequence simply continues (at 505). When the array is completely strobed (at 504) the array is set to a second bias condition 506. The array is then strobed a second time as in the method 400 of FIG. 4. Along these lines, the array is then read out such that each row is selected (at 507) in turn, stimulated by some means (illustrated in FIG. 4(*b*) at 508, and then sampled twice, once (at 509) before strobe 410, and once after (at 511). These values are then sampled and shifted/digitized for further processing (at 512). The sequence continues (at 515) until the entire readout is complete (at 513 and 514). Method 500 shows complete readout of the array, but sub-sets may be read out if desired.

The difference in bias conditions may be used to measure threshold voltage or leakage as in FIGS. 6-9.

Like the method 400, the method 500 results in output voltage that may be characterized in a variety of different ways. These manners of characterization will be described in connection with FIGS. 6-9. However, briefly, the output of the readout mechanism may be used to characterize different features of the transistor such as charging time, discharging time, leakage time and/or turn-on time.

With respect to FIGS. 6-9, it should be noted that the references to RESET, S1, S2, GATE n−1 or PLATE, DATA, Vp and GATE n correspond, in at least one embodiment, to similar references in FIG. 3. Also, in FIGS. 6-9, relative voltage or output is shown over a period of time.

Figure 6:
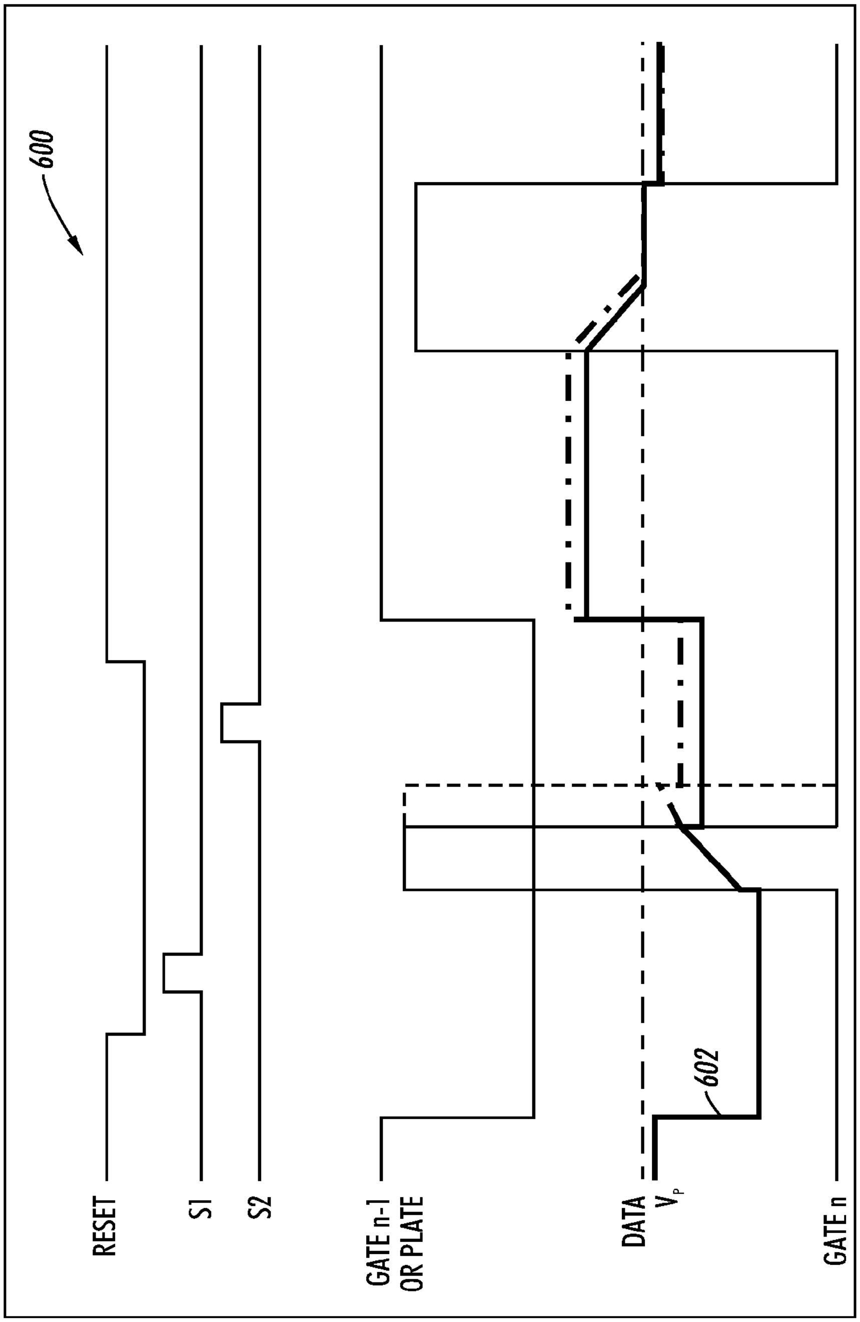
FIG. 6 is a timing diagram showing how variation in strobe timing can be used to measure transistor charging current.
Figure 7:
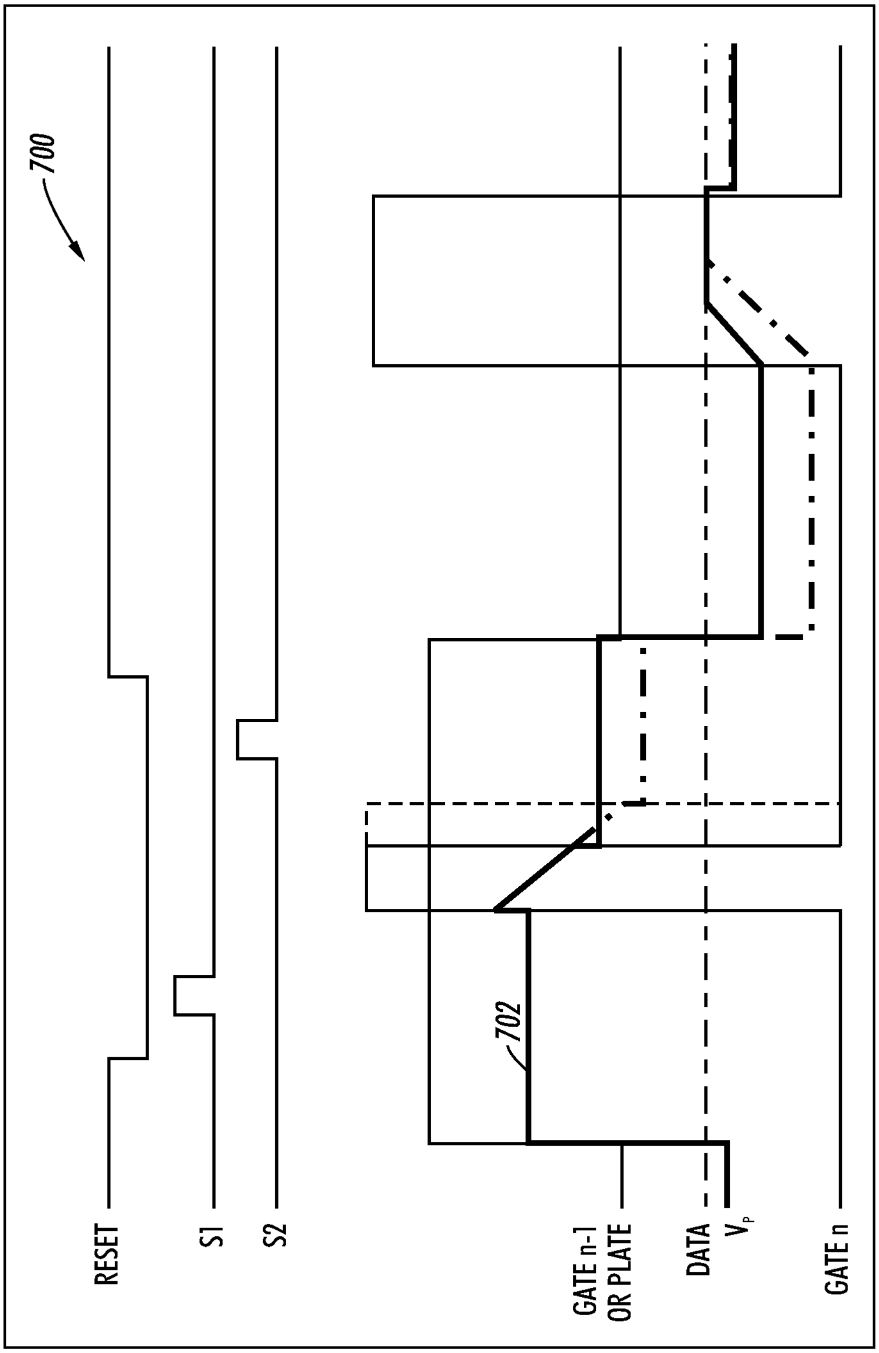
FIG. 7 is a timing diagram showing how variation in strobe timing can be used to measure transistor discharging current.

With reference to FIGS. 6 and 7, as shown by the output voltage, i.e. pixel voltage (Vp), represented by the lines 602 and 702, pixel charging and discharging times may be inferred by varying the time during which the gate is 'on' and measuring the amount of charge collected. Charge is injected or removed from the pixel by a pulse on the other side of the pixel capacitor. When the gate is activated, charging or discharging occurs, followed by a measurement. After the measurement, the pixel is restored to its previous state. The complete cycle is then repeated with the gate activated for a different period. The measurements can be framed by zero (no gate activation) and infinity (the full-charge or -discharge asymptote). Scaling by these factors, the charging and discharging times may be measured.

Figure 8:
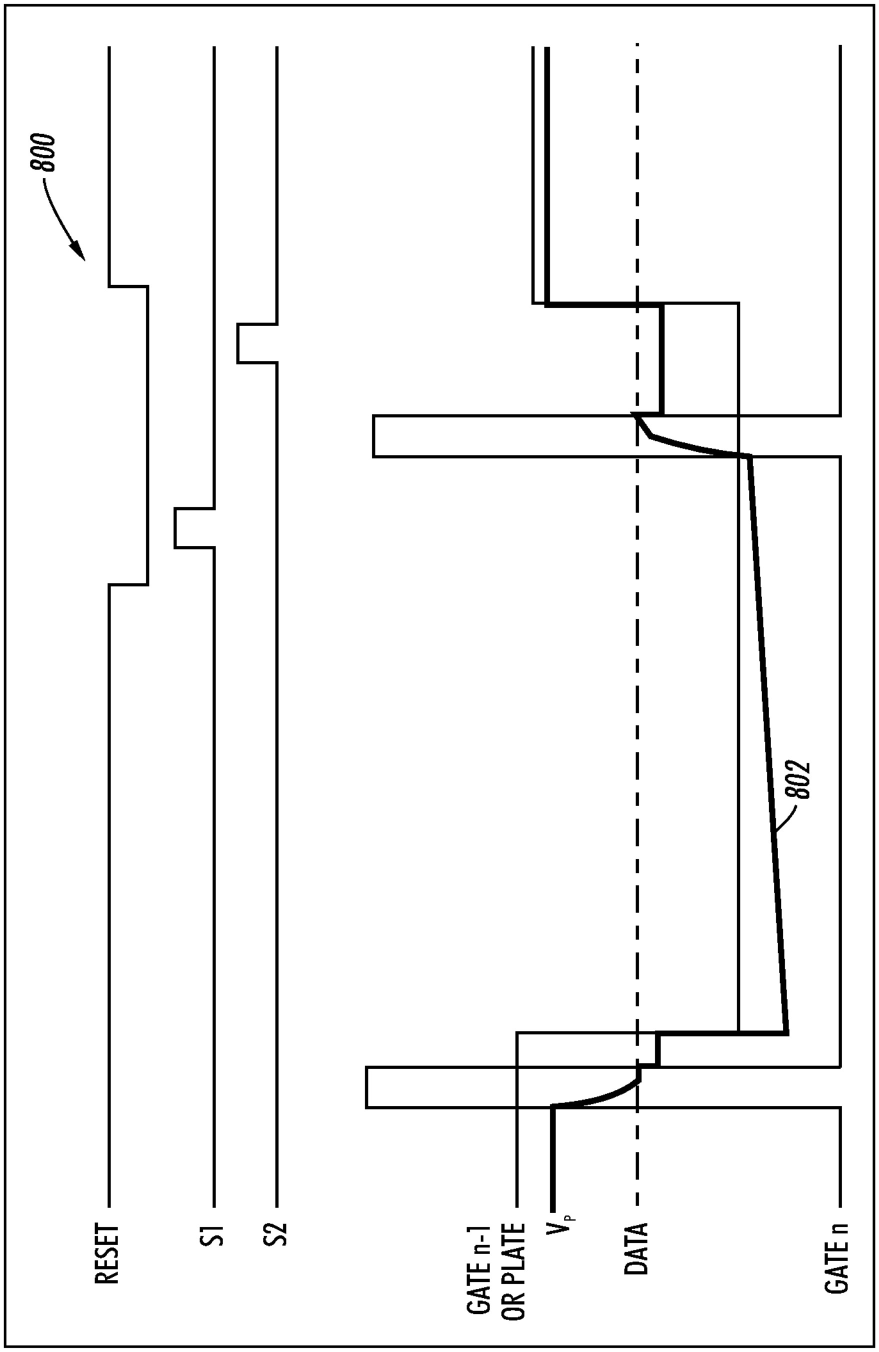
FIG. 8 is a timing diagram showing how variation in plate voltage can be used to measure pixel leakage current.

The measurement of leakage current is depicted by line 802 in FIG. 8. The delay between charging through the pixel capacitor and the measurement of charge on the pixel is varied. By comparison to very short and long times, the discharge time may be measured.

Figure 9:
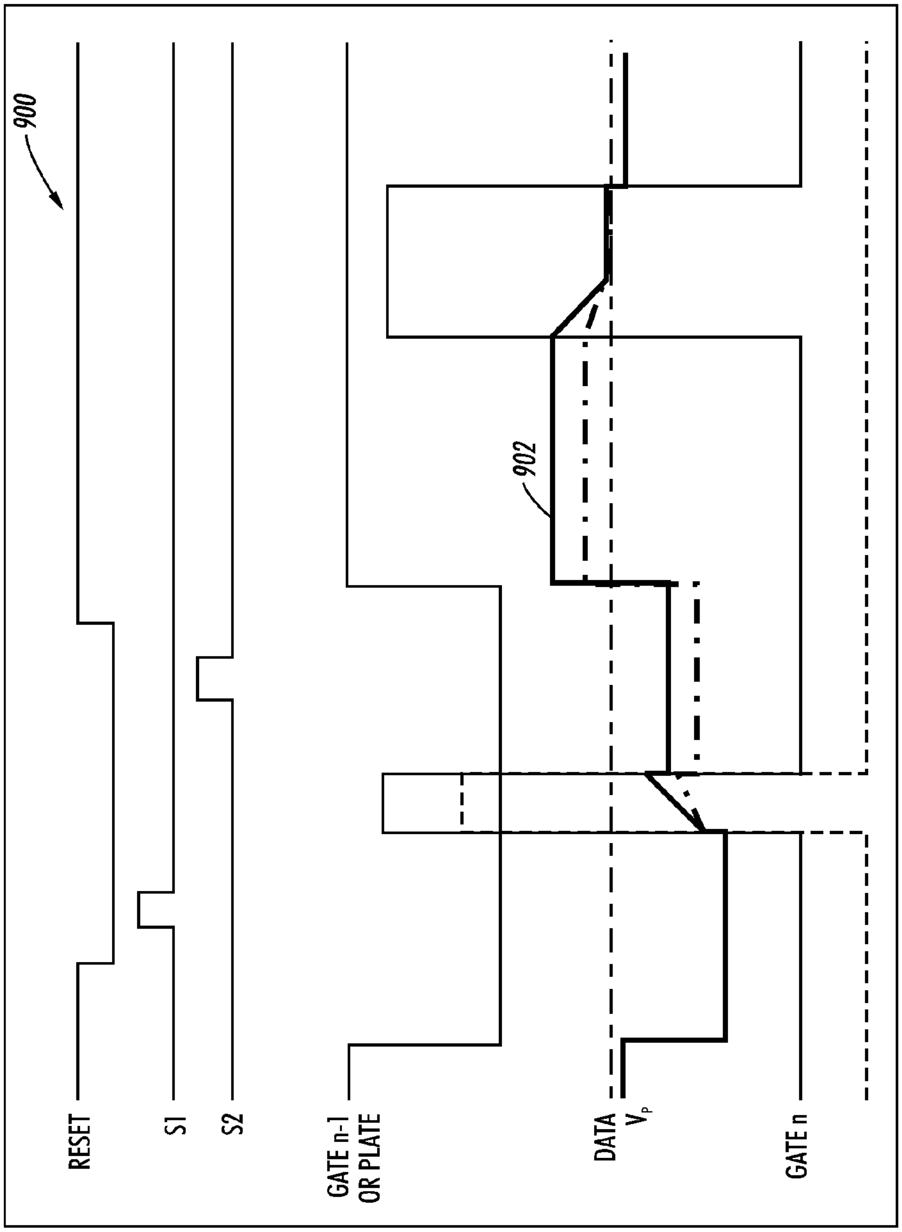
FIG. 9 is a timing diagram showing how variation in strobe voltage can be used to measure pixel conductance and transistor threshold voltage.

Turn-on voltage may also be measured as shown by the line 902 in FIG. 9. This measurement follows the general outline for measuring charging or discharging, but with varying offset between the gate and data signals.

Other measurements may also be realized by the system. The charging/discharging and leakage times may be converted to equivalent resistances by dividing by the pixel capacitance, measured by the ratio of injected signal to calibrated charge measured. The measurement of charging resistance as a function of gate voltage offset can give a rough idea of the transconductance of the transistors. Clearly, other measurements are possible within this framework. Bias stress on transistors may be measured in a limited way by combining, for example, pixel charging time with a stressing sequence beforehand. It is not possible to conduct very general measurements of bias stress, but measurement of turn-on voltage variations is easily done if the magnitude and offset of the gate pulse is controlled.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A system for testing active matrix arrays, the arrays including a plurality of transistors, the system comprising:
- an injecting element operative to apply a drive voltage to selected transistors of an array, wherein the injecting element comprises a removable common array element or capacitive plate or film;
- a readout circuit having amplifiers operative to selectively detect an output signal; and,
- a control circuit operative to control the injecting element and the readout circuit.

2. The system as set forth in claim 1 wherein the injecting element comprises a plate drive circuit.

3. The system as set forth in claim 2 wherein the plate drive circuit is operative to apply a voltage to a plate disposed on the array and the readout circuit is operative to detect the output signal of a transistor in the array.

4. The system as set forth in claim 1 wherein the controller is operative to selectively initiate the application of the drive voltage.

5. The system as set forth in claim 1 wherein the controller is operative to selectively process the output signal.

6. The system as set forth in claim 1 wherein the transistors are pixel elements in a liquid crystal display.

7. The system as set forth in claim 1 wherein the amplifiers are charge or current sensitive column amplifiers.

8. The system as set forth in claim 1 wherein the injecting element comprises a data driver operative to charge the transistors.

9. The system as set forth in claim 1 wherein a bias level is shifted to charge the transistor.

10. The system as set forth in claim 1 wherein the removable common element array or capacitive plate or film is removed prior to application of media to the array.

11. A system for testing active matrix arrays, the arrays including a plurality of transistors, the system comprising:
- an injecting element operative to apply a drive voltage to selected transistors of an array, wherein the injecting element comprises a gate driver operative to apply a voltage to a first transistor;
- a readout circuit having amplifiers operative to selectively detect an output signal, the readout circuit being operative to detect the output signal of a second resistor; and,
- a control circuit operative to control the injecting element and the readout circuit.

12. The system as set forth in claim 11 wherein the controller is operative to selectively initiate the application of the drive voltage.

13. The system as set forth in claim 11 wherein the controller is operative to selectively process the output signal.

14. The system as set forth in claim 11 wherein the transistors are pixel elements in a liquid crystal display.

15. The system as set forth in claim 11 wherein the amplifiers are charge or current sensitive column amplifiers.

16. A system for testing active matrix arrays, the arrays including a plurality of transistors, the system comprising:
- an injecting element operative to apply a drive voltage to selected transistors of an array;
- a readout circuit having amplifiers operative to selectively detect an output signal; and,
- a control circuit operative to control the injecting element and the readout circuit for testing the array before application of media to the array.

17. The system as set forth in claim 16 wherein the injecting element comprises a gate driver.

18. The system as set forth in claim 17 wherein the gate driver is operative to apply a voltage to a first transistor and a readout circuit is operative to detect the output signal of a second transistor.

19. The system as set forth in claim 16 wherein the injecting element comprises a plate drive circuit.

20. The system as set forth in claim 19 wherein the plate drive circuit is operative to apply a voltage to a plate disposed on the array and the readout circuit is operative to detect the output signal of a transistor in the array.

21. The system as set forth in claim 16 wherein the controller is operative to selectively initiate the application of the drive voltage.

22. The system as set forth in claim 16 wherein the controller is operative to selectively process the output signal.

23. The system as set forth in claim 16 wherein the transistors are pixel elements in a liquid crystal display.

24. The system as set forth in claim 16 wherein the amplifiers are charge or current sensitive column amplifiers.

25. The system as set forth in claim 16 wherein the injecting element comprises a data driver operative to charge the transistors.

26. The system as set forth in claim 16 wherein a bias level is shifted to charge the transistor.

* * * * *